(12) United States Patent
Kim et al.

(10) Patent No.: US 10,852,447 B2
(45) Date of Patent: Dec. 1, 2020

(54) PANEL FOR FLEXIBLE DIGITAL X-RAY DETECTOR AND METHOD FOR MANUFACTURING THE SAME

(71) Applicant: LG Display Co., Ltd., Seoul (KR)

(72) Inventors: Jinpil Kim, Paju-si (KR); Minseok Yun, Hwaseong-si (KR)

(73) Assignee: LG Display Co., Ltd., Seoul (KR)

( * ) Notice: Subject to any disclaimer, the term of this patent is extended or adjusted under 35 U.S.C. 154(b) by 43 days.

(21) Appl. No.: 16/211,107

(22) Filed: Dec. 5, 2018

(65) Prior Publication Data

US 2019/0179039 A1 Jun. 13, 2019

(30) Foreign Application Priority Data

Dec. 12, 2017 (KR) .................. 10-2017-0170777

(51) Int. Cl.
*G01T 1/20* (2006.01)
*H01L 27/146* (2006.01)
*G01T 1/202* (2006.01)
*H01L 31/0392* (2006.01)
*H01L 31/18* (2006.01)
*H01L 31/115* (2006.01)

(52) U.S. Cl.
CPC ............ *G01T 1/2018* (2013.01); *G01T 1/202* (2013.01); *H01L 27/14663* (2013.01); *H01L 27/14689* (2013.01); *H01L 27/14692* (2013.01); *H01L 31/03926* (2013.01); *H01L 31/115* (2013.01); *H01L 31/1892* (2013.01)

(58) Field of Classification Search
CPC . G01T 1/2018; G01T 1/202; H01L 27/14663; H01L 27/14689; H01L 27/14692; H01L 31/03926; H01L 31/115; H01L 31/1892
See application file for complete search history.

(56) References Cited

U.S. PATENT DOCUMENTS

2009/0202743 A1\* 8/2009 Schaepkens .......... C23C 14/022
427/576
2010/0207033 A1\* 8/2010 Chen ..................... H01L 31/085
250/370.11
2011/0198505 A1\* 8/2011 Ishida ..................... G01T 1/202
250/363.01

(Continued)

*Primary Examiner* — Marcus H Taningco
(74) *Attorney, Agent, or Firm* — Fenwick & West LLP

(57) ABSTRACT

A panel for a flexible digital X-ray detector and a method for manufacturing the same are disclosed. Embodiments of the flexible digital X-ray detector reduce device characteristic deterioration caused by X-ray exposure, increase flexibility to the panel by reducing a thickness of the panel yet provide rigidity to maintain the shape of the panel, and reduce residual impurities during a Laser Lift Off (LLO) process. The panel can include a multi-buffer layer in which a silicon oxide (SiOx) layer and a silicon nitride (SiNx) layer are alternately stacked, and a device array layer and a scintillator layer that are disposed over the multi-buffer layer. During the LLO process, the method for manufacturing the panel includes increasing the hydrogen content using a sacrificial layer including an amorphous silicon (a-Si) layer and a silicon nitride (SiNx) layer disposed at both surfaces of the a-Si layer, such that the amount of residual impurities in the sacrificial layer can be reduced.

18 Claims, 8 Drawing Sheets

(56) References Cited

U.S. PATENT DOCUMENTS

| | | | |
|---|---|---|---|
| 2015/0144889 A1* | 5/2015 | An | G01T 1/2018 |
| | | | 257/40 |
| 2015/0164447 A1* | 6/2015 | Couture | A61B 6/0421 |
| | | | 250/370.09 |
| 2016/0013243 A1* | 1/2016 | O'Rourke | H01L 27/14609 |
| | | | 257/43 |
| 2018/0102393 A1* | 4/2018 | Liu | H01L 27/14692 |
| 2019/0079201 A1* | 3/2019 | Street | G01T 1/2018 |
| 2019/0333961 A1* | 10/2019 | Wojcik | H01L 27/308 |

* cited by examiner

1

200

PANEL FOR FLEXIBLE DIGITAL X-RAY DETECTOR AND METHOD FOR MANUFACTURING THE SAME

CROSS-REFERENCE TO RELATED APPLICATIONS

This application claims priority to Republic of Korea Patent Application No. 10-2017-0170777 filed on Dec. 12, 2017, with the Republic of Korea Intellectual Property Office, the disclosure of which is hereby incorporated by reference in its entirety.

BACKGROUND

1. Technical Field

The present disclosure relates to a panel for a flexible digital X-ray detector and a method for manufacturing the same.

2. Description of the Related Art

A digital X-ray detector (DXD) refers to an apparatus capable of detecting the transmission amount (e.g., transmissivity) of X-rays passing through a subject and displaying internal images of the subject on a display. With the rapid development of digital technology, a digital X-ray detector based on a thin film transistor (TFT) has recently been developed and rapidly come into medical use.

FIG. 1 is a cross-sectional view illustrating a conventional digital X-ray detector. Referring to FIG. 1, a base substrate 10 for serving as a support substrate of the digital X-ray detector 1 is first disposed. In this case, the base substrate 10 is generally formed of a glass substrate.

A thin film transistor layer 20 and a PIN diode layer 30 connected to the thin film transistor layer 20 may be disposed over the base substrate 10. Generally, the digital X-ray detector 1 is generally designed to have several thousand or tens of thousands of pixels or many more pixels according to the size or resolution thereof, such that the thin film transistor layer 20 includes a plurality of thin film transistors corresponding to respective pixels and the PIN diode layer 30 includes a plurality of PIN diodes corresponding to the respective pixels. A scintillator layer 40 including a scintillator may be disposed over the PIN diode layer 30.

When X-rays are received by the digital X-ray detector, the scintillator converts the incident X-rays into visible light, such that the visible light is transmitted to the PIN diode. The visible light applied to the PIN diode is re-converted into an electronic signal in the PIN diode. The electronic signal is converted into an image signal after passing through the thin film transistor connected to the PIN diode, such that the resultant image signal is displayed on a display.

In this way, the digital X-ray detector is unavoidably exposed to X-rays, such that a negative shift occurs in a threshold voltage of the thin film transistor exposed to X-rays, resulting in deterioration of device characteristics.

In addition, not only device deterioration caused when the device is directly exposed to X-rays, but also additional deterioration caused by a base substrate of a digital X-ray detector during X-ray emission may occur in the conventional digital X-ray detector.

Deterioration of the characteristics of such thin film transistor (TFT) may result in deterioration in the performance of the digital X-ray detector. Hence, a solution to the device characteristic deterioration caused by X-rays in the digital X-ray detector is of importance to the digital X-ray detector.

The conventional digital X-ray detector uses a support substrate as a rigid glass substrate, such that it is difficult for the conventional digital X-ray detector to be used as a flexible digital X-ray detector. In recent times, the demands of users who desire to use the flexible digital X-ray detector have not yet been satisfied.

Specifically, the glass substrate serves as a support substrate of the digital X-ray detector, and also serves as a device formation substrate for forming various devices. Thus, the demand of users who desire to use a flexible digital X-ray detector capable of supporting the shape of the digital X-ray detector and at the same time appropriately forming a plurality of devices when the glass substrate is not used, is rapidly increasing.

SUMMARY

Embodiments relate to a panel for a flexible digital X-ray detector. The panel includes a multiple layered buffer stack, a device array layer, and a scintillator. The multiple layered buffer stack includes a first flexible layer and a second flexible layer that are alternately stacked. The device array layer is disposed over the multiple layered buffer stack and comprises at least one thin film transistor and at least one PIN diode connected to the at least one thin film transistor. The at least one PIN diode configured to generate an electrical signal responsive to receiving light, and the at least one thin film transistor configured to transmit a detection signal to a readout circuit in response to receiving the electrical signal from the PIN diode. The scintillator layer is disposed over the device array layer, and the scintillator layer is configured to generate the light responsive to receiving an x-ray.

In some embodiments, the multiple layered buffer stack is a lowest layer of the panel.

In some embodiments, the multiple layered buffer stack includes at least three layers.

In some embodiments, the panel further comprises an organic layer disposed between the device array layer and the scintillator layer, the organic layer configured to reduce a height difference caused by an arrangement of the device array layer. In some embodiments, the scintillator layer includes a plurality of scintillator columnar crystals arranged on the organic layer. In some embodiments, the device array layer is on the multiple layered buffer stack, the organic layer is on the device array layer, and the scintillator layer is on the organic layer.

In some embodiments, the panel further comprises a protective layer that covers the scintillator layer and the device array layer.

In some embodiments, the panel further comprises a reflective layer that covers the protective layer, the reflective layer configured to prevent the light generated from the scintillator layer from leaking outside of the flexible digital X-ray detector.

In some embodiments, the first flexible layer is a silicon oxide (SiOx) layer and the second flexible layer is a silicon nitride (SiNx) layer.

In some embodiments, a lower electrode of the at least one PIN diode is electrically connected to a source electrode of the at least one thin film transistor.

Embodiments also relate to a method for manufacturing a panel for a flexible digital X-ray detector. A sacrificial layer is formed over a sacrificial substrate. A multiple layered buffer stack is formed over the sacrificial layer, the multiple layered buffer stack including a first flexible layer and a second flexible layer stacked alternately. A device array layer is formed over the multiple layered buffer stack. The device array layer includes at least one PIN diode that generates an electrical signal responsive to receiving light and at least one thin film transistor that transmits a detection signal to a readout circuit in response to receiving the electrical signal from the PIN diode. A scintillator layer is formed over the device array layer to generate light responsive to receiving an X-ray. The sacrificial layer and the multiple layered buffer stack are separated.

In some embodiments, the sacrificial layer includes an amorphous silicon (a-Si) layer and a silicon nitride (SiNx) layer disposed at both surfaces of the amorphous silicon (a-Si) layer.

In some embodiments, the method includes forming an organic layer between the device array layer and the scintillator layer, wherein the scintillator layer is formed by growing a plurality of scintillator columnar crystals on the organic layer. In some embodiments, the device array layer is formed on the multiple layered buffer stack and the organic layer is formed on the device.

In some embodiments, the separating of the sacrificial layer and the multiple layered buffer stack is performed using a laser life off (LLO) process.

In some embodiments, after separating the sacrificial layer from the multiple layered buffer stack, the multiple layered buffer stack forms a lowest layer of the panel.

In some embodiments, the first flexible layer is a silicon oxide (SiOx) layer and the second flexible layer is a silicon nitride (SiNx) layer.

In some embodiments, the multiple layered buffer stack includes at least three layers.

In some embodiments, the method further comprises forming a protective layer over the scintillator layer and the device array layer and forming a reflective layer over the protective layer to prevent light generated from the scintillator layer from leaking outside of the flexible digital X-ray detector.

In some embodiments, a lower electrode of the at least one PIN diode is electrically connected to a source electrode of the at least one thin film transistor.

DETAILED DESCRIPTION

Figure 1:
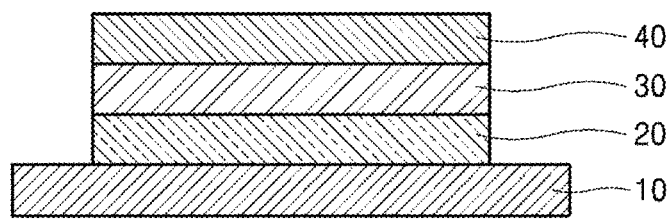
FIG. 1 is a cross-sectional view illustrating a panel for a conventional digital X-ray detector according to the related art.

The above objects, features, and advantages will become apparent from the detailed description with reference to the accompanying drawings. Embodiments are described in sufficient detail to enable those skilled in the art in the art to easily practice the technical idea of the present disclosure. Detailed descriptions of well-known functions or configurations may be omitted in order not to unnecessarily obscure the gist of the present disclosure. Hereinafter, embodiments of the present disclosure will be described in detail with reference to the accompanying drawings. Throughout the drawings, like reference numerals refer to like elements.

The embodiments of the present disclosure will hereinafter be described with reference to the attached drawings.

In the following description, assuming that a certain object is formed above (over) or below (beneath) the respective constituent elements, this means that two constituent elements are brought into direct contact with each other, or one or more constituent elements are disposed and formed between two constituent elements. In addition, assuming that a certain object is formed over or below the respective constituent elements, this means that the object may also be arranged in upward or downward directions on the basis of the position of one constituent element.

It will be understood that when one element is referred to as being "connected to", "coupled to", or "accessed by" another element, one element may be "connected to", "coupled to", or "accessed by" another element via a further element although one element may be directly connected to or directly accessed by another element.

Figure 2:
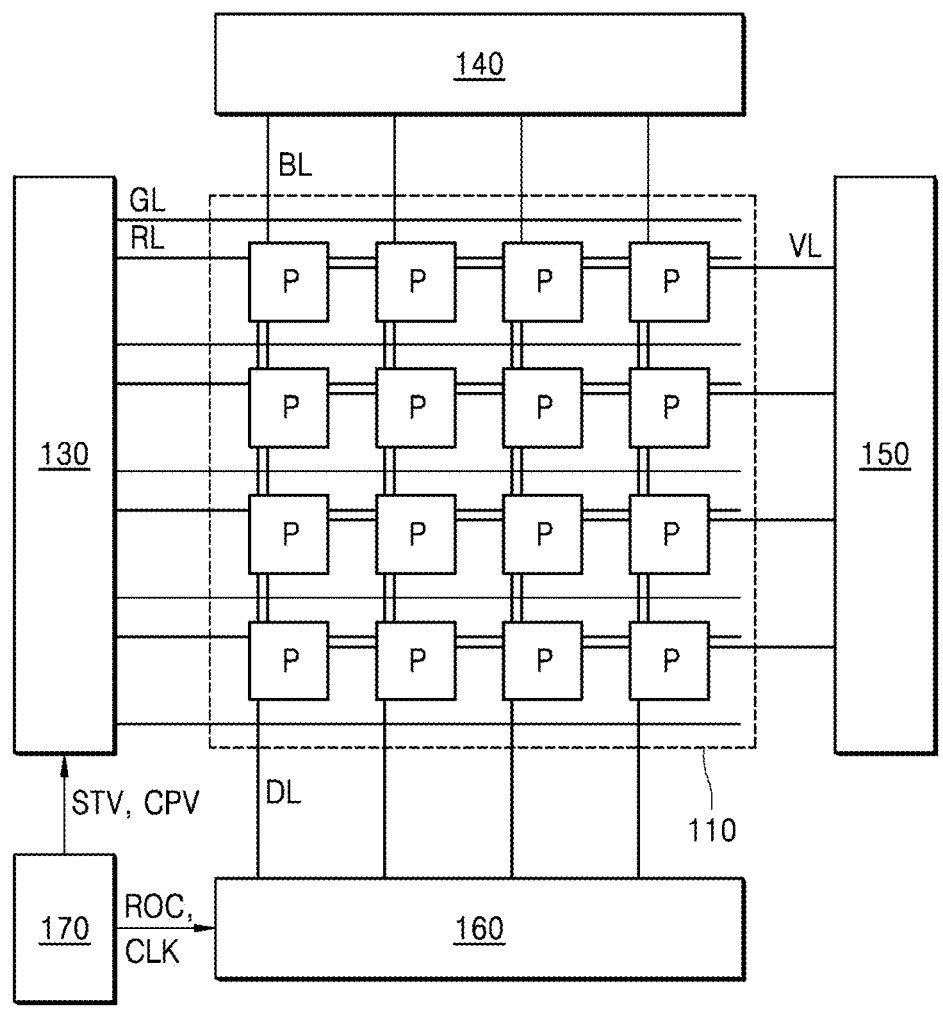
FIG. 2 is a cross-sectional view illustrating a panel for a digital X-ray detector according to an embodiment of the present disclosure.

FIG. 2 is a schematic plan view illustrating a digital X-ray detector. Referring to FIG. 2, the digital X-ray detector may include a thin film transistor (TFT) array 110, a gate driver 130, a bias supplier 140, a power-supply voltage supplier 150, a readout circuit 160, and a timing controller 170.

The TFT array 110 may sense X-rays emitted from an energy source, may perform photoelectric conversion of the sensed signal, and may thus output an electrical detection signal. In the TFT array 110, each cell region may be defined not only by a plurality of gate lines (GL) arranged in a horizontal direction, but also by a plurality of data lines (DL) arranged in a vertical direction perpendicular to the horizontal direction. Each cell region of the TFT array 110 may include a plurality of photosensitive pixels (P) arranged in a matrix.

Each photosensitive pixel (P) may include a PIN diode configured to sense light converted from X-rays and output the sensed light as a signal, and a thin film transistor (TFT) configured to transmit a detection signal output from the PIN diode in response to a gate signal. One side of the PIN diode may be connected to the thin film transistor (TFT), and the other side thereof may be connected to a bias line (BL).

A gate electrode of the thin film transistor (TFT) may be connected to the gate line (GL) through which a scan signal is transmitted, a source electrode may be connected to the PIN diode, and a drain electrode may be connected to the data line (DL) through which the detection signal is transmitted. The bias line BL may be arranged parallel to the data line (DL).

The gate driver 130 may sequentially apply a plurality of gate signals, each of which has a gate-ON voltage level, through the gate lines (GL). The gate driver 130 may also apply a plurality of reset signals, each of which has a gate-ON voltage level, through a plurality of reset lines (RL). Here, the gate-ON voltage level may refer to a voltage level at which thin film transistors of the photosensitive pixels can be turned on. The thin film transistors of the photosensitive pixels may be turned on in response to a gate signal or a reset signal.

The gate driver 130 may be an integrated circuit (IC) such that the gate driver 130 may be populated on an external substrate connected to the TFT array 110 or may be formed over the TFT array 110 through a Gate In Panel (GIP) process.

The bias supplier 140 may apply a drive voltage through bias lines (BL). The bias supplier 140 may apply a predetermined voltage to the PIN diode. In this case, the bias supplier 140 may selectively apply a reverse bias or a forward bias to the PIN diode.

The power-supply voltage supplier 150 may supply a power-supply voltage to the photosensitive pixels through power-supply voltage lines (VL).

The readout circuit 160 may read out the detection signal generated from the thin film transistor (TFT) that is turned on in response to the gate signal. Accordingly, the detection signal generated from the PIN diode may be input to the readout circuit 160 through the data lines (DL).

The readout circuit 160 may include a signal detector, a multiplexer, etc. The signal detector may include a plurality of amplification circuits corresponding to the data lines (DL) on a one to one basis, and each amplification circuit may include an amplifier, a capacitor, a reset element, etc.

In order to control the gate driver 130, the timing controller 170 may generate a start signal (STV), a clock signal (CPV), etc., and may transmit the start signal (STV), the clock signal (CPV), etc. to the gate driver 130. In order to control the readout circuit 160, the timing controller 170 may generate a readout control signal (ROC), a readout clock signal (CLK), etc., and may transmit the readout control signal (ROC), the readout clock signal (CLK), etc. to the readout circuit 160.

Figure 3:
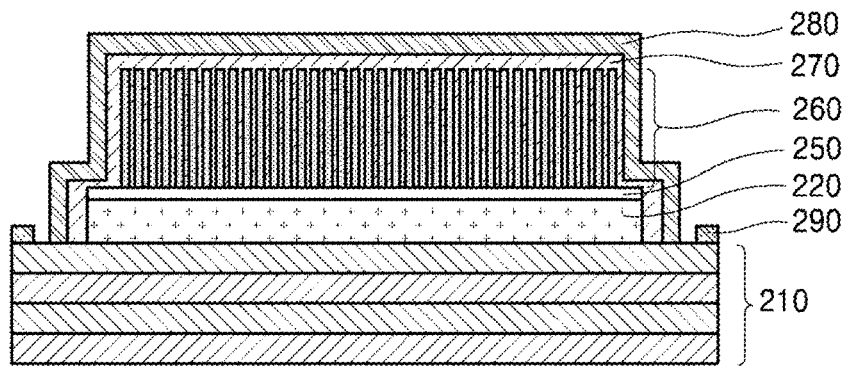
FIG. 3 is a cross-sectional view illustrating a panel for a flexible digital X-ray detector according to an embodiment of the present disclosure.
Figure 4:
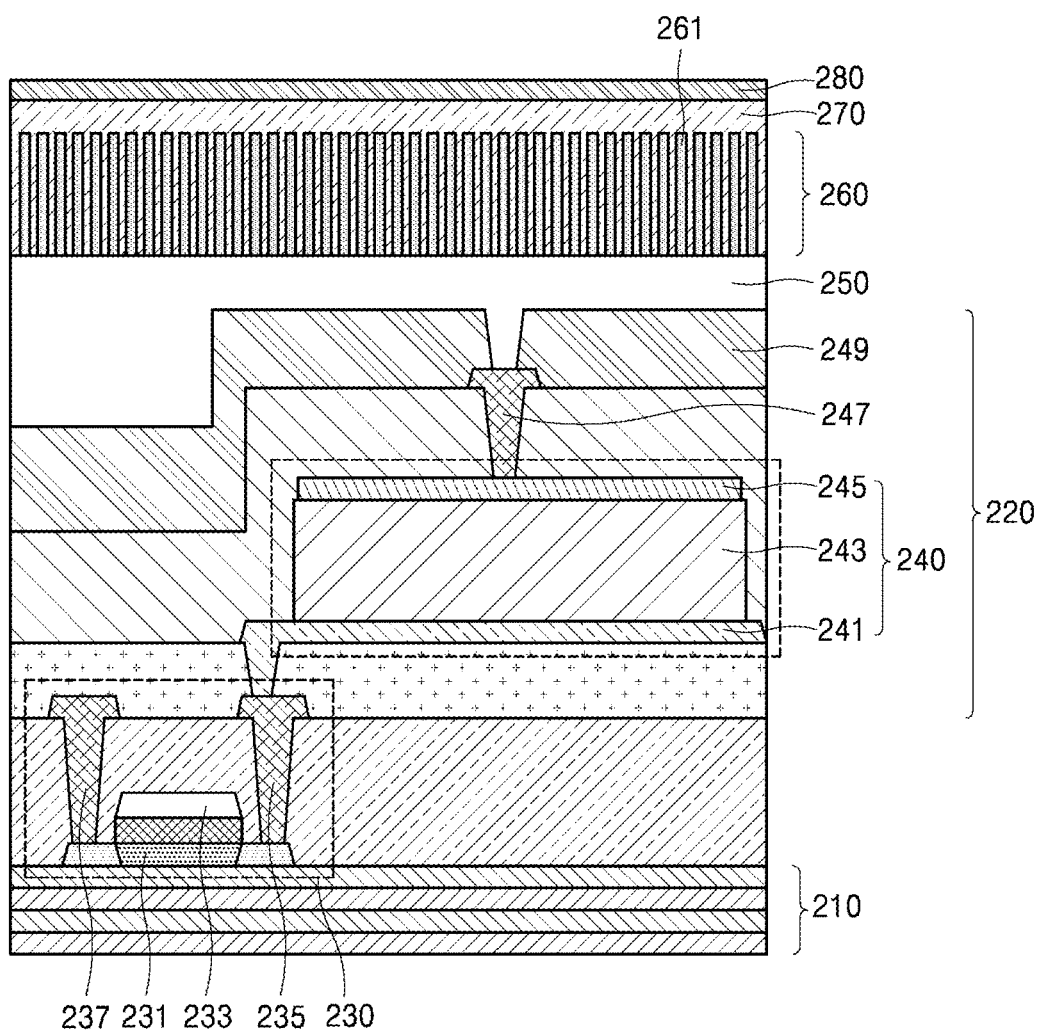
FIG. 4 is a cross-sectional view illustrating a panel for a flexible digital X-ray detector corresponding to a single pixel according to an embodiment of the present disclosure.

A panel for a digital X-ray detector according to one embodiment of the present disclosure will hereinafter be described with reference to FIGS. 2, 3 and 4.

A panel 200 for a flexible digital X-ray detector 200 according to the embodiment of the present disclosure may include multiple buffer layers (hereinafter referred to as a multi-buffer layer or a multiple layered buffer stack) 210 in which a silicon oxide ($SiO_x$) layer and a silicon nitride ($SiN_x$) layer are alternately stacked, a device array layer 220 that is disposed over the multi-buffer layer 210 and has a thin film transistor 230 and a PIN diode 240 connected to the thin film transistor 230 (e.g., see FIG. 4), and a scintillator layer 260 disposed over the device array layer 220.

The multi-buffer layer 210 serving as the lowest layer of the panel 200 may be disposed such that the $SiO_x$ layers and the $SiN_x$ layers are alternately stacked to form at least three layers. For example, the $SiO_x$ layers and the $SiN_x$ layers may be alternately stacked in the form of various buffer layers, for example, $SiO_x/SiN_x/SiO_x$, $SiN_x/SiO_x/SiN_x$, $SiO_x/SiN_x/SiO_x/SiN_x$, $SiN_x/SiO_x/SiN_x/SiO_x$, etc.

Differently from the conventional digital X-ray detector in which the base substrate is used as the lowest substrate, the panel 200 for the flexible digital X-ray detector according to the embodiment of the present disclosure does not have a base substrate, and the multi-buffer layer 210 forms the lowest layer of the panel 200, such that the entire thickness of the panel 200 is reduced and flexibility can be more effectively allocated to the panel 200.

In addition, the multi-buffer layer 210 forms the lowest layer of the panel 200, such that the multi-buffer layer 210 does not have a separate base substrate. As a result, device deterioration capable of being additionally generated by the base substrate during X-ray emission can be reduced.

Due to characteristics of the digital X-ray detector, a threshold voltage of a device such as a thin film transistor (TFT) undergoes a negative shift when the device is exposed to X-rays. In this case, if a separate base substrate such as a glass substrate or a polyimide (PI) substrate is arranged in the digital X-ray detector, carrier variation of the thin film transistor occurs during X-ray emission, such that the additional threshold-voltage negative shift phenomenon occurs during X-ray emission, and thus device deterioration becomes more serious.

Specifically, the negative shift phenomenon caused by the PI substrate is about two or more times greater than the negative shift phenomenon caused by the glass substrate. Therefore, the panel 200 for the flexible digital X-ray detector in which the base substrate is removed and the multi-buffer layer 210 forms the lowest layer of the panel 200 may have flexibility and may reduce device deterioration.

In addition, since the base substrate is removed from the panel 200 according to the present disclosure, the thin film transistor 230 or the PIN diode 240 included in the device array layer 220 may be vulnerable to external moisture or oxygen penetration.

Therefore, the panel 200 according to the present disclosure includes a multi-buffer layer 210 in which the $SiO_x$ layer and the $SiN_x$ layer are alternatively stacked to form at least three layers in the lowest layer, instead of including a single buffer layer in the lowest layer, such that devices of the device array layer can be minimally affected by external moisture and oxygen penetration.

The thin film transistor 230 and the device array layer 220 including the PIN diode 240 connected to the thin film transistor 230 may be disposed over the multi-buffer layer 210.

In this case, a pad part 290 including various lines may be disposed at the edge of the multi-buffer layer 210, and the device array layer 220 may be formed in a manner that spacing of the edge of the multi-buffer layer 210 remains.

In the device array layer 220, pixel regions P (not shown in FIG. 3) may be defined by intersection regions of the gate lines GL arranged in one direction and the data lines DL arranged in the other direction perpendicular to the gate lines GL, and each of the pixel regions may include a thin film transistor 230 and a PIN diode 240.

The thin film transistor 230 may include an active layer 231, a gate electrode 233, a source electrode 235, and a drain electrode 237. In this case, the active layer 231 may be formed of an oxide semiconductor material such as indium gallium zinc oxide (IGZO), Low Temperature Polycrystalline Silicon (LTPS), or amorphous silicon (a-Si).

The thin film transistor 230 may be connected to the PIN diode 240 that includes a lower electrode 241, a PIN layer 243, and an upper electrode 245. In more detail, the lower electrode 241 may be connected to the source electrode 235 of the thin film transistor 230. The PIN layer 243 in which an N-type (negative) semiconductor layer having N-type impurities, an intrinsic (I-type) semiconductor layer having no impurities, and a P-type (positive) semiconductor layer including P-type impurities are sequentially stacked, may be formed.

The PIN layer 243 may include a material capable of converting X-rays emitted from an energy source into an electric signal. For example, the PIN layer 243 may include amorphous selenium (a-Se), mercuric iodide (HgI2), cadmium telluride (CdTe), lead oxide (PbO), lead iodide (PbI2), bismuth triiodide (BiI3), gallium arsenide (GaAs), germanium (Ge), and the like.

The upper electrode 245 of the PIN diode may be connected to the bias electrode 247 through which a voltage is applied to the PIN diode 240. A passivation layer 249 may be a monolayer or multilayer structure formed of a silicon oxide (SiOx) film or a silicon nitride (SiNx) film. The passivation layer 249 may be formed over the bias electrode 247. In this case, the passivation layer 249 may be disposed to cover the entire surface of the device array layer 220 other than a contact hole of the bias electrode 247, thereby protecting the device array layer 220.

The internal structure of the above-mentioned device array layer 220 is merely exemplary, and the scope or spirit of the present disclosure is not limited thereto. In the device array layer 220, the arrangement format of various devices, for example, the thin film transistor 230, the PIN diode 240, and the bias electrode 247 may include various modified examples.

An organic layer 250 may be disposed over the device array layer 220. The organic layer 250 may reduce a step difference caused by arrangement of the devices included in the device array layer 220, and may be used as a planarization layer such that the scintillator layer 260 disposed at an upper part can be formed at the planarized surface.

In addition, the organic layer 250 may serve as a growth base layer such that the scintillator can be formed as a plurality of columnar crystals (CC) 261 on the basis of the organic layer 250.

In more detail, the panel 200 for the flexible digital X-ray detector according to the embodiment of the present disclosure may allow the scintillator layer 260 to be disposed over the device array layer 220 without formation of a separate adhesive layer.

That is, the scintillator layer 260 may be grown in the vertical direction in a manner that the scintillator layer 260 has a plurality of columnar crystals (CC) 261 through deposition by using the organic layer 250 as a growth base layer between the device array layer 220 and the scintillator layer 260, such that the plurality of scintillator columnar crystals (CCs) may be arranged in parallel. In this case, although the scintillator is formed of cesium iodide (CsI), the scope or spirit of the present disclosure is not limited thereto.

The panel 200 according to the present disclosure can form the scintillator layer 260 over the device array layer 220 without having a separate adhesive layer, such that the entire thickness of the panel 200 can be greatly reduced, and more effective flexibility can be given to the panel 200.

In addition, the scintillator layer 260 may serve as a support substrate to provide rigidity to maintain the overall shape of the panel 200. As described above, the embodiments of the present disclosure can remove the base substrate from the panel and use the lowest layer of the panel 200 as the multi-buffer layer 210 such that the panel has increased flexibility and the possibility of additional device deterioration is reduced.

Therefore, the scintillator layer 260 may serve as a support substrate to provide rigidity through which the scintillator layer 260 has flexibility and the entire shape of the panel 200 is maintained. As a result, the base substrate is reduced in thickness such that flexibility can be more effectively given to the panel 200.

In addition, a protective layer 270 may be formed to cover the scintillator layer 260 and the device array layer 220 at the scintillator layer 260, such that the scintillator layer 260 may be formed to have stronger supporting force.

The protective layer 270 may be formed of parylene. The protective layer 270 may be formed to cover the scintillators arranged in the plurality of columnar crystals (CCs) 261, and may also be formed to bury spaces between the neighboring CCs 261.

A reflective layer 280 covering the protective layer 270 may be additionally disposed over the protective layer 270, and may prevent light from leaking outside.

The protective layer 270 and the reflective layer 280 may be disposed to cover the entire surface of the multi-buffer layer 210 other than the pad part 290 disposed at the edge of the device array layer 220.

The panel 200 for the above-mentioned flexible digital X-ray detector may operate as follows.

X-rays emitted towards and received by the flexible digital X-ray detector panel 200 may be converted into visible light by the scintillator layer 260. The visible light may be converted into an electronic signal by the PIN layer 243 of the PIN diode 240.

In more detail, when visible light is emitted towards and received by the PIN layer 243, the intrinsic semiconductor layer is depleted by the P-type semiconductor layer and the N-type semiconductor layer, and thus generates an electric field therein. Electrons and holes generated by light may be drifted by the electric field, and are then collected in the P-type semiconductor layer and in the N-type semiconductor layer, respectively.

The PIN diode 240 may convert visible light into an electronic signal, and may deliver the electronic signal to the thin film transistor 230. The delivered electronic signal may be displayed as an image signal after passing through the data line DL connected to the thin film transistor 230.

Figure 7:
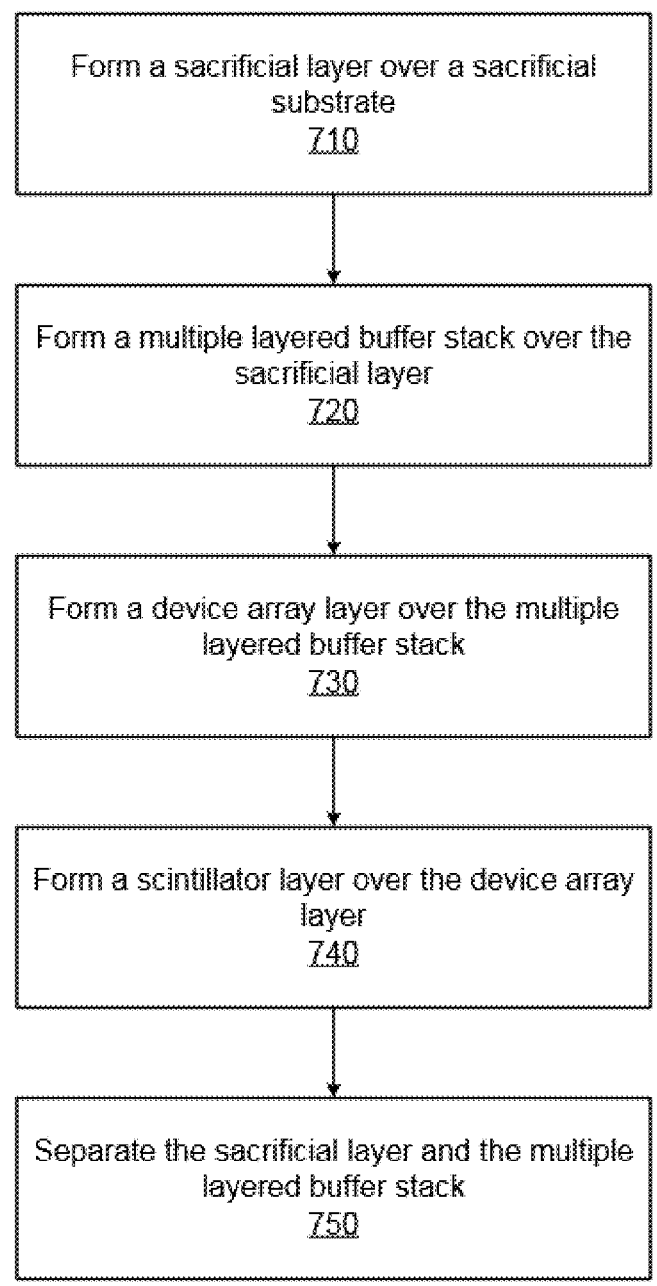
FIG. 7 is a flowchart of a method for manufacturing a panel for a flexible digital X-ray detector according to an embodiment of the present disclosure.

FIGS. 5A to 5E illustrate a method for manufacturing a panel for a flexible digital X-ray detector according to an embodiment of the present disclosure, and FIG. 7 is a flowchart of a method for manufacturing a panel for a flexible digital X-ray detector according to an embodiment of the present disclosure. A method for manufacturing the panel according to the embodiment of the present disclosure will hereinafter be described with reference to FIGS. 5A to 5E and with reference to FIG. 7.

A method for manufacturing the panel 200 of the flexible digital X-ray detector according to the embodiment of the present disclosure may include forming 710 a sacrificial layer 320 over a sacrificial substrate 310, forming 720 a multi-buffer layer 210 in which the $SiO_x$ layer and the $SiN_x$ layer are alternately stacked over the sacrificial layer 320, forming 730 a device array layer 220 having a thin film transistor 230 and a PIN diode 240 connected to the thin film transistor 230 over the multi-buffer layer 210, forming 740 a scintillator layer 260 over the device array layer 220, and separating 750 the sacrificial layer 320 and the multi-buffer layer 210.

The sacrificial substrate 310 may be a region that will be isolated and removed by the next process such as laser lift off (LLO) in a subsequent process, and may serve as a base substrate for forming the sacrificial layer 320, the multi-buffer layer 210, and the device array layers 220. The glass substrate may be used as a sacrificial substrate 310.

Figure 5A:
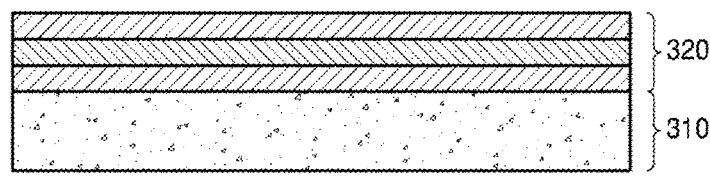
FIGS. 5A to 5E illustrate a method for manufacturing a panel for a flexible digital X-ray detector according to an embodiment of the present disclosure.

As shown in FIG. 5A, a sacrificial layer 320, which includes the amorphous silicon (a-Si) layer and the $SiN_x$ layer disposed at both sides of the amorphous silicon (a-Si) layer, may be disposed over the sacrificial substrate 310. In this case, the respective layers may be formed using a common deposition method, and the formation method is not specially limited thereto.

Figure 5B:
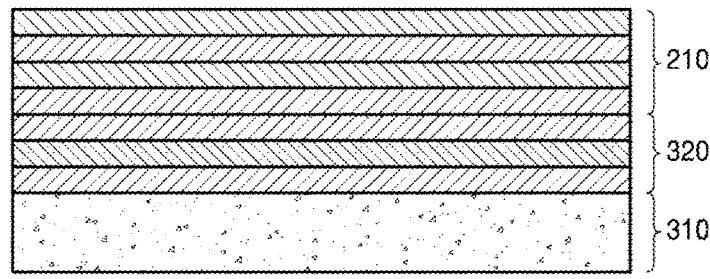

Referring to FIG. 5B, the multi-buffer layer 210 in which the $SiO_x$ layer and the $SiN_x$ layer are alternately stacked to form at least three layers may be formed over the sacrificial layer 320.

Figure 5C:
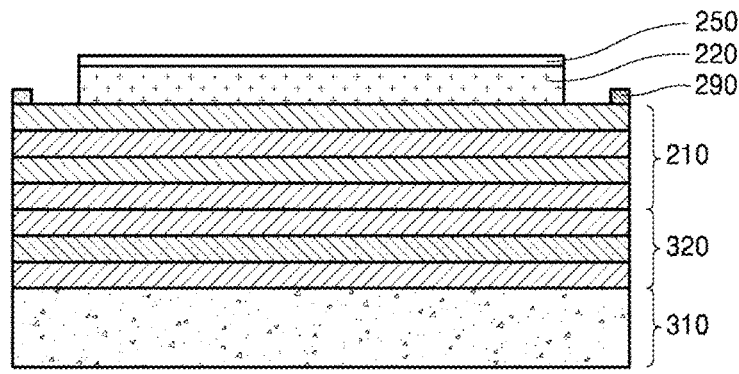
Figure 5D:
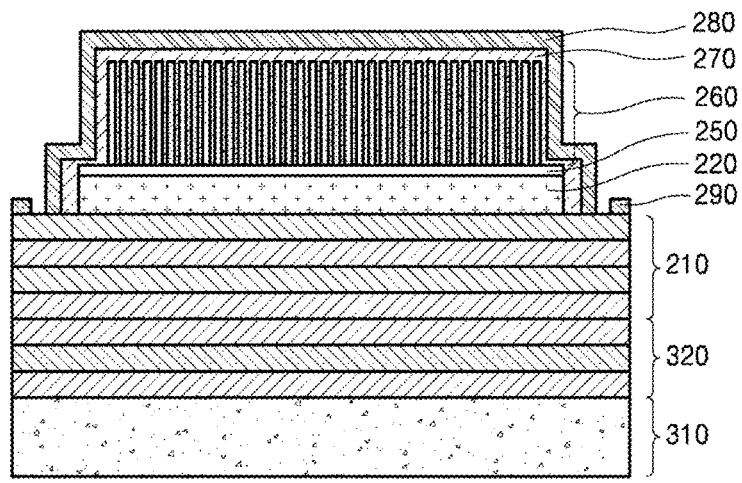

Referring to FIG. 5C, the device array layer 220 including the thin film transistor 230 and the PIN diode 240 connected to the thin film transistor 230 may be formed over the multi-buffer layer 210, and the pad part 290 may be formed at the edge region of the multi-buffer layer 210. In this case, the arrangement format of the thin film transistor 230 and the PIN diode 240 included in the device array layer 220 has various modified examples, without being limited to a specific structure, and a detailed description thereof will herein be omitted for convenience of description.

An organic layer 250 for planarizing the device array layer 220 may be formed over the device array layer 220.

A plurality of CC (Columnar Crystal)-shaped scintillators may be grown through deposition on the organic layer 250 such that the CC-shaped scintillators can be vertically arranged in parallel, resulting in formation of the scintillator layer 260. In this case, the organic layer 250 may also serve as a growth base layer for growing the scintillator columnar crystals (CCs) 261.

The protective layer 270 and the reflective layer 280 may be formed over the scintillator layer 260, thereby covering the columnar crystals (CCs) 261 and the device array layer 220.

Figure 5E:
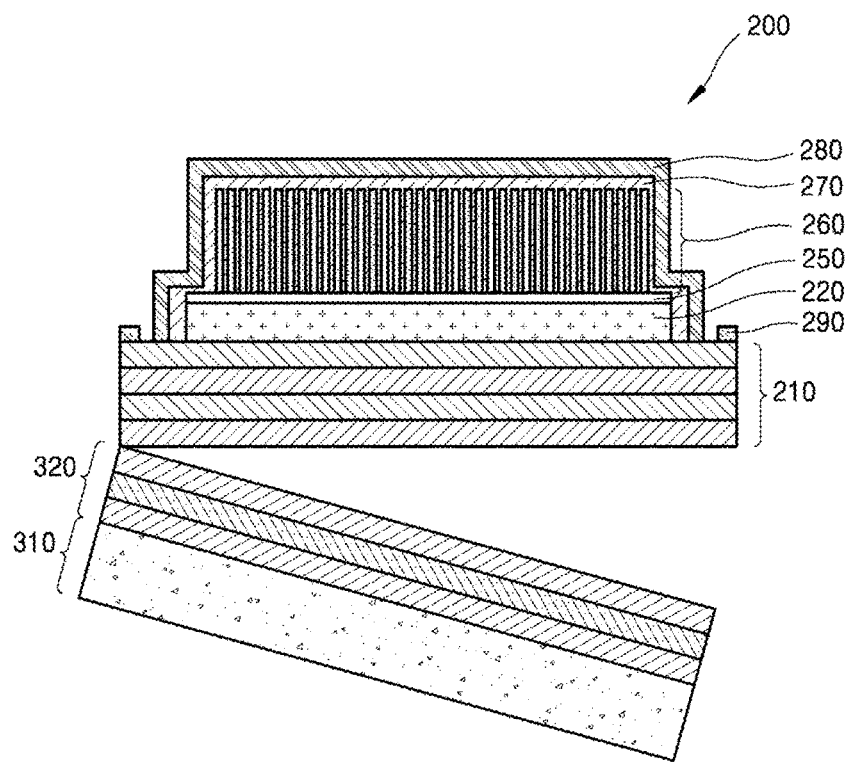

Referring to FIG. 5E, the interface between the sacrificial layer 320 and the multi-buffer layer 210 is isolated such that the sacrificial substrate 310 and the sacrificial layer 320 are removed. As a result, the panel 200 for the flexible digital X-ray detector according to the embodiment of the present disclosure can be obtained.

The process for isolating the interface according to the present disclosure may be performed by the LLO process, and a detailed description thereof will hereinafter be given in detail.

The LLO process refers to a process for using amplified laser to isolate device layers stacked on the sacrificial substrate 310 from the sacrificial substrate 310. Generally, laser light is emitted towards and received by the sacrificial substrate 310, and the interfacial bonding between the sacrificial layers 320 of the sacrificial substrate 310 and the device layers is destroyed, such that the sacrificial layers 320 and the device layers can be isolated from one another.

Generally, if the base substrate such as the polyimide (PI) substrate is formed in the LLO process, the sacrificial layer 320 may be formed of the amorphous silicon (a-Si) material.

In this case, hydrogen swelling occurs between the polyimide (PI) layer acting as an organic layer and the sacrificial layer 320 during laser emission, such that the sacrificial substrate 310 can be isolated. The hydrogen (H) content at the interface may be important to the LLO process.

However, the present disclosure may not use a separate base substrate, and can use the multi-buffer layer 210 of the inorganic film as the lowest layer, such that there is a need to increase the hydrogen content at the interface.

Therefore, the $SiN_x$ layer having a high hydrogen content is disposed at both sides of the amorphous silicon (a-Si) layer, such that the hydrogen content of the sacrificial layer 320 is increased.

As a result, the hydrogen content at the interface between the sacrificial layer 320 and the multi-buffer layer 210 increases, such that the sacrificial substrate 310 and the sacrificial layer 320 can be easily isolated from each other by the LLO process even when a separate base substrate is not used.

In addition, the embodiment of the present disclosure does not form a separate base substrate at the lower part of the multi-buffer layer 210 so as to reduce additional device deterioration as well as to increase flexibility, such that the multi-buffer layer 210 composed of at least three layers may be formed below the device array layer 220. The multi-buffer layer composed of at least three layers can allow the device array layer 220 to be minimally affected by laser light during LLO processing.

Figure 6A:
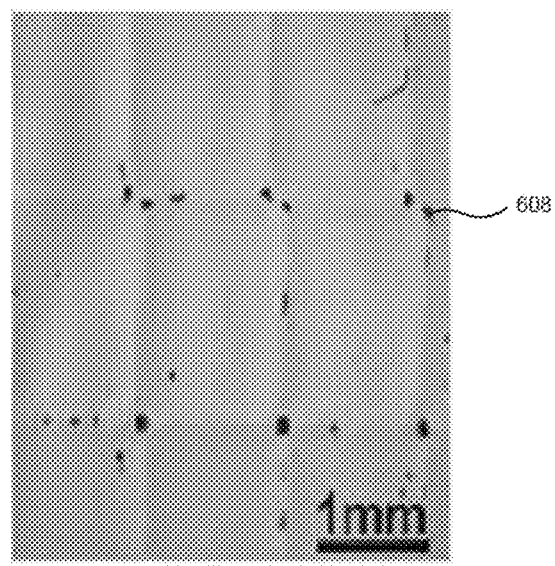
FIGS. 6A and 6B are photographs illustrating the presence or absence of residual impurities in a sacrificial layer for use in an example and a comparison example that are classified according to layer structures of the sacrificial layer of a panel for a flexible digital X-ray detector.
Figure 6B:
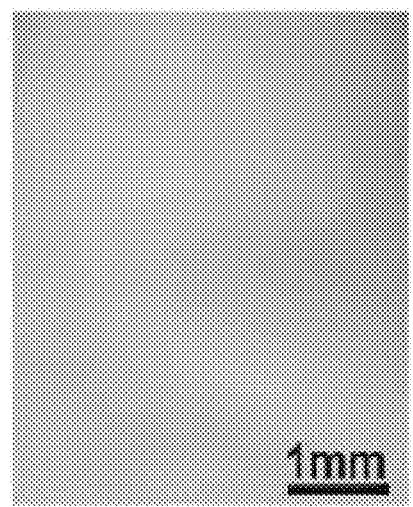

FIG. 6A is a photograph illustrating the presence or absence of residual impurities for use in a comparison example in which a sacrificial layer is formed of amorphous silicon (a-Si) only, and FIG. 6B is a photograph illustrating the presence or absence of residual impurities for use in an example in which the LLO (laser lift off) process is performed in the embodiment based on a sacrificial layer.

In more detail, FIG. 6A illustrates a comparison example for a case in which the sacrificial layer is formed of the amorphous silicon (a-Si) material only, and FIG. 6B illustrates an example of a case in which the sacrificial layer is formed by arranging silicon nitride (SiNx) at both surfaces of the amorphous silicon (a-Si) layer such that the sacrificial layer is isolated from the multi-buffer layer through laser lift off (LLO) processing according to an embodiment of the present disclosure.

As can be seen from FIG. 6A, if the sacrificial layer is formed of amorphous silicon (a-Si) alone, the operation for removing and isolating the sacrificial layer using laser light is not completely performed, such that a large amount of residual impurities formed of amorphous silicon (a-Si) remains (e.g., see impurity 610).

However, if the silicon nitride (SiNx) layer having a high hydrogen content is disposed at both surfaces of the amorphous silicon (a-Si) layer, hydrogen swelling occurs in the $SiN_x$ layer due to laser light, and the sacrificial layer can be sufficiently removed and isolated from the multi-buffer layer, such that it can be confirmed that hardly any residual impurities remain.

As is apparent from the above description, the embodiments of the present disclosure may reduce device deterioration caused by a base substrate during X-ray emission because the lowest layer of a panel is composed of multiple buffer layers without having a separate base substrate.

The embodiments of the present disclosure may allow a scintillator layer to serve as a support substrate that is capable of providing rigidity to maintain the shape of a panel without using a separate base substrate and the junction between the device layer and the scintillator layer can be formed without and adhesive layer, such that a total thickness of the panel is reduced and the panel has increased flexibility.

The embodiments of the present disclosure may use a sacrificial layer that includes an amorphous silicon (a-Si) layer and a silicon nitride (SiNx) layer disposed at both surfaces of the amorphous silicon (a-Si) layer during LLO (Laser Lift Off) processing, may effectively isolate a sacrificial layer from a sacrificial substrate by increasing hydrogen content at an interface, and may reduce the amount of residual impurities remaining in the sacrificial layer after isolation between the sacrificial layer and the sacrificial substrate.

The present disclosure described above may be variously substituted, altered, and modified by those skilled in the art to which the present disclosure pertains without departing from the scope and sprit of the present disclosure. Therefore, the present disclosure is not limited to the above-mentioned exemplary embodiments and the accompanying drawings.

What is claimed is:

1. A panel for a flexible digital X-ray detector comprising:
   a multiple layered buffer stack in which a first flexible layer and a second flexible layer are alternately stacked;
   a device array layer disposed over the multiple layered buffer stack, the device array layer comprising at least one thin film transistor and at least one PIN diode connected to the at least one thin film transistor, the at least one PIN diode configured to generate an electrical signal responsive to receiving light, the at least one thin film transistor configured to transmit a detection signal to a readout circuit in response to receiving the electrical signal from the at least one PIN diode; and
   a scintillator layer disposed over the device array layer, the scintillator layer configured to generate the light responsive to receiving an X-ray,
   wherein the multiple layered buffer stack is a lowest layer of the panel.

2. The panel of claim 1, wherein the multiple layered buffer stack includes at least three layers.

3. The panel of claim 1, further comprising:
   an organic layer disposed between the device array layer and the scintillator layer, the organic layer configured to reduce a height difference caused by an arrangement of the device array layer.

4. The panel of claim 3, wherein the scintillator layer includes a plurality of scintillator columnar crystals arranged on the organic layer.

5. The panel of claim 3, wherein the device array layer is on the multiple layered buffer stack, the organic layer is on the device array layer, and the scintillator layer is on the organic layer.

6. The panel of claim 1, further comprising:
   a protective layer that covers the scintillator layer and the device array layer.

7. The panel of claim 6, further comprising:
   a reflective layer that covers the protective layer, the reflective layer configured to prevent the light generated from the scintillator layer from leaking outside of the flexible digital X-ray detector.

8. The panel of claim 1, wherein the first flexible layer is a silicon oxide (SiOx) layer and the second flexible layer is a silicon nitride (SiNx) layer.

9. The panel of claim 1, wherein a lower electrode of the at least one PIN diode is electrically connected to a source electrode of the at least one thin film transistor.

10. A method for manufacturing a panel for a flexible digital X-ray detector comprising:
    forming a sacrificial layer over a sacrificial substrate;
    forming a multiple layered buffer stack over the sacrificial layer, the multiple layered buffer stack including a first flexible layer and a second flexible layer stacked alternately;
    forming a device array layer over the multiple layered buffer stack, the device array layer including at least one PIN diode that generates an electrical signal responsive to receiving light and at least one thin film transistor transmitting a detection signal to a readout circuit in response to receiving the electrical signal from the at least one PIN diode;
    forming a scintillator layer over the device array layer to generate light responsive to receiving an X-ray; and
    separating the sacrificial layer from the multiple layered buffer stack after forming the scintillator layer over the device layer,
    wherein, after separating the sacrificial layer from the multiple layered buffer stack, the multiple layered buffer stack forms a lowest layer of the panel.

11. The method of claim 10, wherein the sacrificial layer includes:
    an amorphous silicon (a-Si) layer and a silicon nitride (SiNx) layer disposed at both surfaces of the amorphous silicon (a-Si) layer.

12. The method of claim 10, further comprising:
    forming an organic layer between the device array layer and the scintillator layer,
    wherein the scintillator layer is formed by growing a plurality of scintillator columnar crystals on the organic layer.

13. The method of claim 12, wherein the device array layer is formed on the multiple layered buffer stack and the organic layer is formed on the device array layer.

14. The method of claim 10, wherein the separating of the sacrificial layer and the multiple layered buffer stack is performed using a laser lift off (LLO) process.

15. The method of claim 10, wherein the first flexible layer is a silicon oxide (SiOx) layer and the second flexible layer is a silicon nitride (SiNx) layer.

16. The method of claim 10, wherein the multiple layered buffer stack includes at least three layers.

17. The method of claim 10, further comprising:
    forming a protective layer over the scintillator layer and the device array layer; and
    forming a reflective layer over the protective layer to prevent light generated from the scintillator layer from leaking outside of the flexible digital X-ray detector.

18. The method of claim 10, wherein a lower electrode of the at least one PIN diode is electrically connected to a source electrode of the at least one thin film transistor.

* * * * *